United States Patent [19]

Bohannon, Jr.

[11] 4,043,094
[45] Aug. 23, 1977

[54] METHOD AND APPARATUS FOR PROCESSING TAPED COMPONENTS

[75] Inventor: William D. Bohannon, Jr., Winston-Salem, N.C.

[73] Assignee: Western Electric Company, Inc., New York, N.Y.

[21] Appl. No.: 617,765

[22] Filed: Sept. 29, 1975

[51] Int. Cl.² ............................................. B65B 19/34
[52] U.S. Cl. ............................................. 53/3; 53/23; 53/123; 53/196
[58] Field of Search .................. 53/3, 23, 196, 123; 83/213, 214, 218, 222, 226, 227, 566, 600, 318, 319, 322, 425, 426, 427; 221/30; 227/85, 88, 89, 90, 91, 136; 29/621

[56] References Cited

U.S. PATENT DOCUMENTS

| | | | |
|---|---|---|---|
| 2,791,772 | 5/1957 | Cardani et al. | 227/90 |
| 3,164,839 | 1/1965 | Kafka | 227/85 |
| 3,375,857 | 4/1968 | Berg | 83/218 X |
| 3,421,284 | 1/1969 | Zemer | 221/30 X |
| 3,568,908 | 3/1971 | Bader | 227/136 |
| 3,669,309 | 6/1972 | Romeo | 53/123 X |
| 3,701,233 | 10/1972 | Luckman, Jr. | 53/196 X |
| 3,730,041 | 5/1973 | Zemer et al. | 83/278 |
| 3,796,363 | 3/1974 | Ragard | 227/90 |
| 3,907,008 | 9/1975 | Bates et al. | 227/88 X |

Primary Examiner—Leonidas Vlachos
Assistant Examiner—John Sipos
Attorney, Agent, or Firm—D. D. Bosben

[57] ABSTRACT

In a system for processing strips of taped axial lead components of different types and values extending from separate supplies, wherein the leads of the components are joined together by elongated tapes, the strips of the components are advanced linearly through a bank of fluid-operated processing heads of essentially planar configuration arranged in closely spaced side-by-side relationship. As each strip of components is advanced through its respective processing head, each component is automatically centered within the head, regardless of the length of the component's body, and its leads are severed to equal lengths from their respective tapes. As the leads of each component are severed, the component is discharged directly onto a conveyor which carries the component to a test station and then to a station in which the leads of the component are retaped for subsequent use in a component inserting machine. Each processing head also includes a mechanism which, just prior to the severing of the leads of each component, cuts the tapes into small segments to facilitate the ejection, storage and disposal thereof. The processing heads are slidably mounted for movement into and out of operative positions independently of one another, and are retained in their operative positions against vibration by an air-cushion clamping mechanism.

27 Claims, 15 Drawing Figures

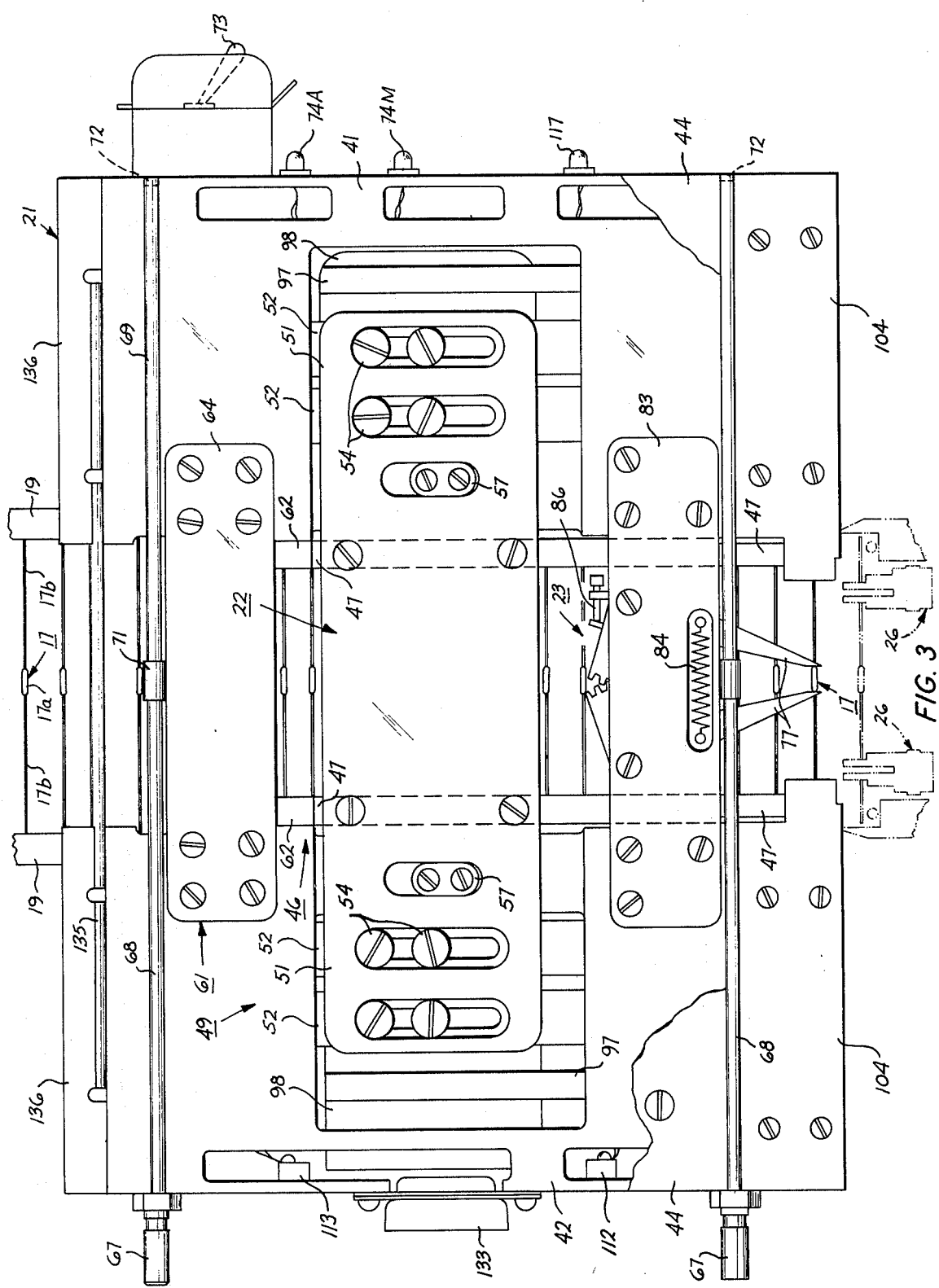

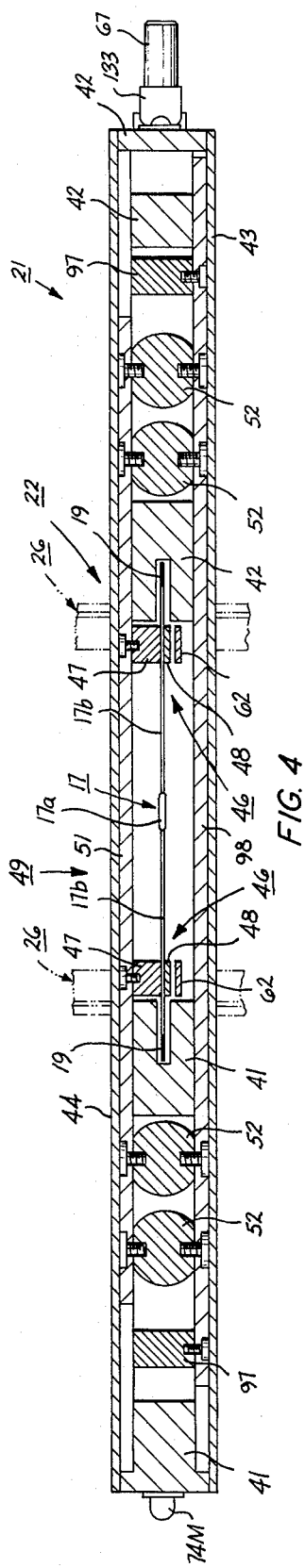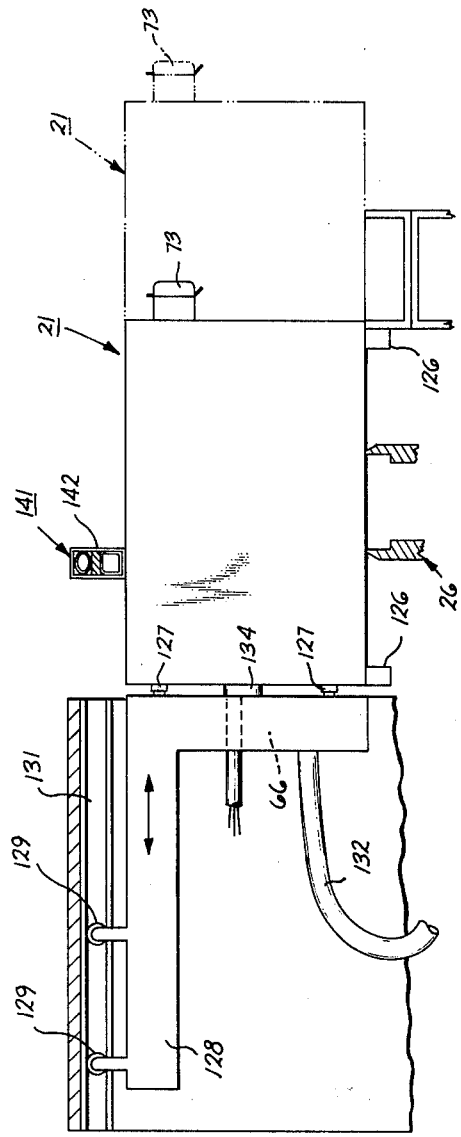

4,043,094

METHOD AND APPARATUS FOR PROCESSING TAPED COMPONENTS

BACKGROUND OF THE INVENTION

1. Field of the Invention

This invention relates to a method and apparatus for processing taped components, and more particularly to an economical method and apparatus for rapidly processing strips of different taped axial lead components extending from separate supplies, including retaping of the components in a desired sequence on close preselected center-to-center spacings for subsequent use in a component inserting machine.

2. Description of the Prior Art

In the manufacture of axial lead electrical components such as resistors, capacitors, diodes and varistors, it is advantageous to join the leads of the components together by elongated adhesive tapes in the form of ladder-type strips, to facilitate storage and handling of the components. Accordingly, the leads of the components are made longer than that which is required for insertion in an electrical device, such as a printed circuit board, to permit taping of outer portions of the leads. The taped outer lead portions subsequently are severed from the remainder of the leads and discarded as scrap. Further, since a printed circuit board normally utilizes only a small number of each type or value of a plurality of different components, it frequently is desirable to sever the leads of the different components from their taped out lead portions, and then to retape the components in a desired sequence of component type and/or value on close preselected center-to-center spacings (e.g., ⅜ inch) for subsequent use in a component inserting machine.

Heretofore, apparatus for this purpose has generally been of the type disclosed in the U.S. Pat. No. 3,421,284 issued Jan. 19, 1969 to A. W. Zemek, wherein strips of taped components are fed from separate supplies through a set of respective processing stations. In this type of apparatus, each strip of components is advanced through its respective processing station in a circular path by rotatable gear-driven sprockets having peripheral notches for drivingly engaging the spaced leads of the components. More recently, the U.S. Pat. No. 3,730,041, issued May 1, 1973 to A. W. Zemek et al., has disclosed an axial lead dispenser head in which a strip of taped components is initially advanced linearly through the head by an oscillating crank shaft and connecting link drive arrangement. The components then feed along an arcuate path and the component leads are cut to length by rotary oscillating cutting blades. The U.S. Pat. No. 3,878,026, issued Apr. 15, 1975 to M. D. Snyder et al., which is directed to an electrical component sequencing and retaping machine, discloses the cutting of scrap tapes containing outer lead portions into small segments after the component leads have been cut from the tapes.

In prior art axial component sequencing apparatus, as a strip of the taped components is advanced through each processing station, the leads of the components are severed to equal lengths from outer taped portions of the leads, and the components then are deposited on a continuous conveyor for subsequent retaping of the severed leads. In one type of arrangement for this purpose, the conveyor is indexed beneath the processing stations and the stations are selectively energized to deposit the components onto the conveyor so that as the conveyor leaves the processing stations the components are arranged on the conveyor in a desired sequence and the above-mentioned closely spaced center-to-center relationship for retaping of the component leads. In this type of arrangement, since prior known processing stations have been of significantly greater side-to-side thickness than the desired close spacing of the components for retaping, a minimum of 5 to 6 indexes of the conveyor are required before all positions on the conveyor can be filled.

An alternative component sequencing arrangement which has been utilized involves selectively dispensing the components from the processing stations onto a continuously driven first conveyor "on the fly," and subsequently discharging the components from the first conveyor into a gathering or "bunching" device, which then feeds the components onto a second conveyor in the desired closely spaced relationship for retaping. In another similar known system utilizing a continuously operating conveyor, the components are fed directly into a retaping device which gathers them into the desired closely spaced relationship for retaping, with testing of the components being accomplished after they have been retaped, thus requiring cutting of the tapes to remove a defective component, and then the splicing of a new component into the retaped strip in its place.

Accordingly, the purpose of the subject invention is to provide a new and improved compact system for rapidly processing taped electrical components in an economical and efficient manner as compared to prior known systems for this purpose.

SUMMARY OF THE INVENTION

In accordance with one aspect of this invention, as a strip of components having leads joined in spaced relationship by interconnecting tapes is advanced along a linear path, the leads of the components are cut to length from the tapes and simultaneously fed along the linear path directly into closely spaced positions on preselected center-to-center spacings.

In accordance with another aspect of this invention, apparatus for processing components having leads joined by elongated tapes includes a reciprocable feed mechanism for advancing the components linearly along a preselected linear path, a mechanism for cutting the leads of the components to length from outer taped portions of the leads, and a linearly recriprocable drive mechanism for operating the feed mechanism. The drive, feed and lead cutting mechanisms preferably are located in essentially coplanar relationship within planar limits containing the path of advancement of the components, with the drive mechanism including at least one fluid-type operating cylinder and a piston rod slidable in the cylinder and connected to the feed mechanism. Further, as the components are advanced through the processing head toward the lead cutting mechanism, a centering mechanism automatically centers the body of each component therebetween with respect to the lead cutting mechanism, regardless of the length of the component body, to insure cutting of the leads of the component to equal length on opposite sides of the body. Prior to each lead cutting operation, a mechanism responsive to reciprocal movement of the feed mechanism and located in essentially coplanar relationship therewith, may cut the taped outer portions of the leads from the remainder of the tapes to facilitate ejection, storage and disposal of the taped under portions.

In accordance with a further aspect of this invention, apparatus for processing strips of different taped components extending from a plurality of separate supplies, wherein bodies of the components have projecting leads joined by elongated tapes, includes a bank of processing heads of essentially planar configuration as described in the preceding paragraph, slidably mounted in side-by-side relationship for movement into and out of operative positions independently of one another. An air-cushion clamping mechanism retains the processing heads in their operative positions and precludes vibration thereof. A single conveyor is movable beneath the processing heads for receiving the components from the heads in a desired sequence and on preselected center-to-center center spacings as the leads of the components are severed to length from the tapes, with the processing heads preferably being located on center-to-center spacings not greater than twice the preselected spacings of the components on the conveyor, after which the component leads are retaped on the conveyor on the preselected center-to-center spacings as the components are advanced by the conveyor.

BRIEF DESCRIPTION OF THE DRAWINGS

FIG. 3 is an elevational view of the opposite side of the processing head shown in FIG. 2;

FIG. 4 is a cross-sectional view of the processing head shown in FIGS. 2 and 3, taken along the line 4—4 in FIG. 2;

FIG. 10 is a side elevational view illustrating a mechanism for supporting one of the processing heads shown in FIGS. 2 and 3 for movement into and out of an operative position;

DETAILED DESCRIPTION

Figure 1:
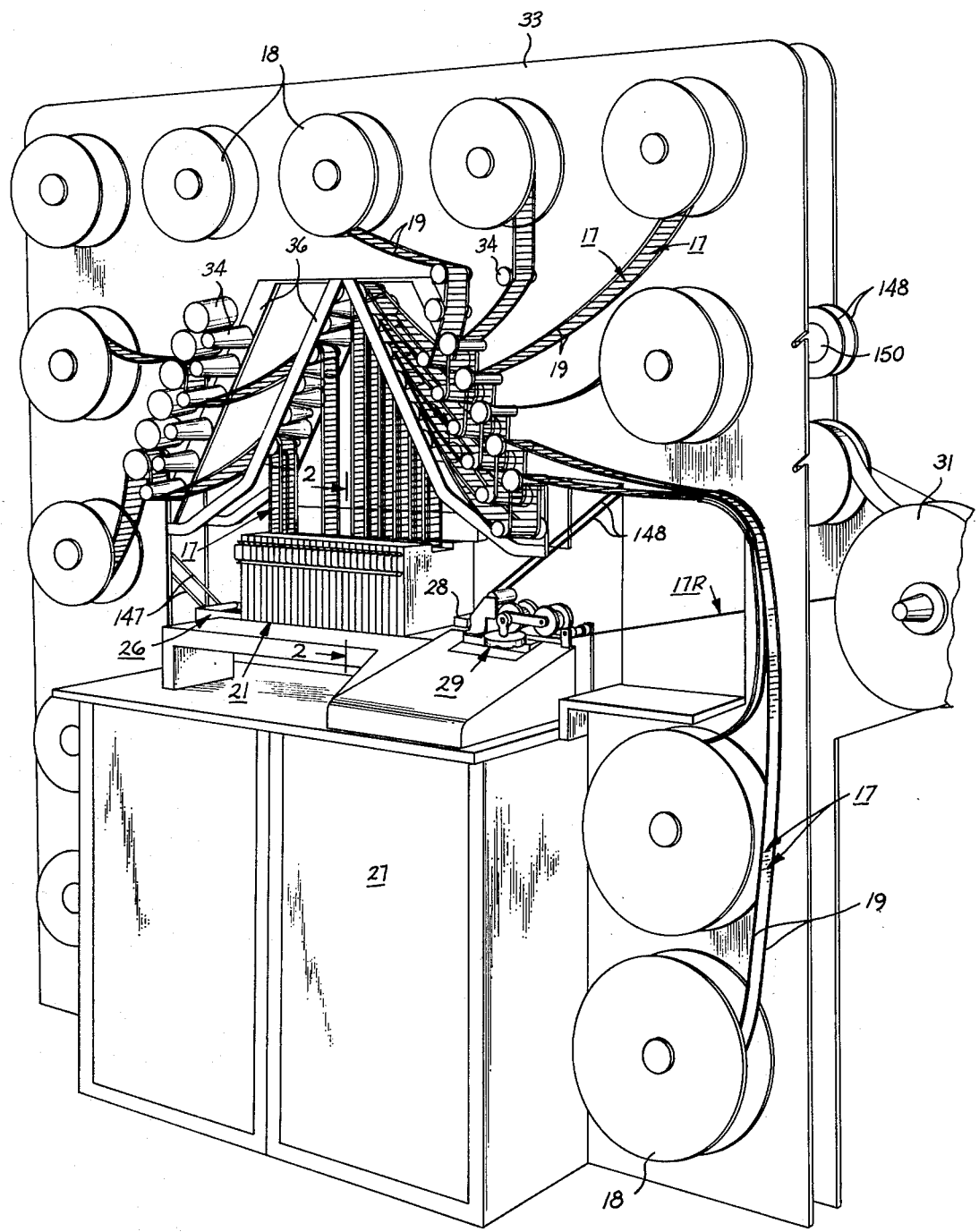
FIG. 1 is an isometric front elevational view of an apparatus for processing taped components in accordance with the invention, with a processing head clamping mechanism (FIGS. 11 and 12) omitted.

Referring to FIG. 1, the disclosed embodiment of the invention is directed to apparatus for processing strips of different taped components 17 extending from a plurality of separate supply reels 18. The components may be, for example, diodes, resistors, capacitors or varistors of various sizes (electrically and physically), each having a body 17a (FIG. 2) with opposite axially extending leads 17b, and with outer portions of the axial leads joined by elongated adhesive tapes 19 in a ladder-type arrangement.

Figure 2:
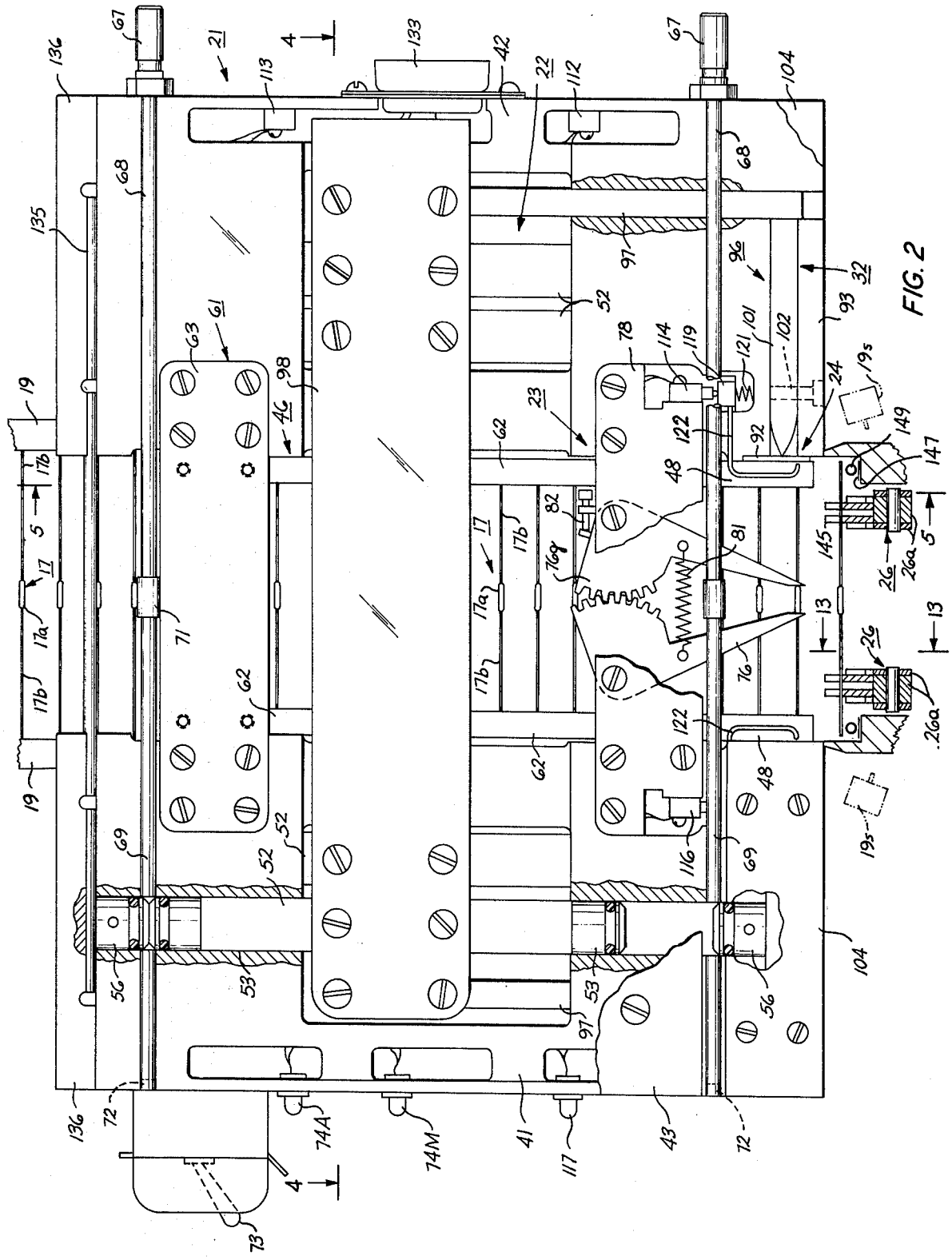
FIG. 2 is a side elevational view of a processing head for use in the apparatus shown in FIG. 1, taken along the line 2—2 in FIG. 1.

The strips of components 17 are fed from the supply reels 18 linearly through respective ones of a bank of self-contained processing or sequencing heads 21 which are of essentially planar configuration such that the heads can be mounted in side-by-side relationship on relatively close centers. Referring to FIGS. 2 and 3, as each strip of components 17 is advanced through its respective processing head 21 by a feed mechanism 22 (FIG. 3) within the head, each component in the strip initially is automatically centered in the head by a centering mechanism 23, regardless of the length of the component's body 17a. The component's leads 17b then are cut to equal length from the taped outer portions of the leads 17b by a lead severing mechanism 24, (FIG. 2) and the component is discharged from the head onto a continuous loop-type conveyor 26 (FIG. 2).

Figure 9:
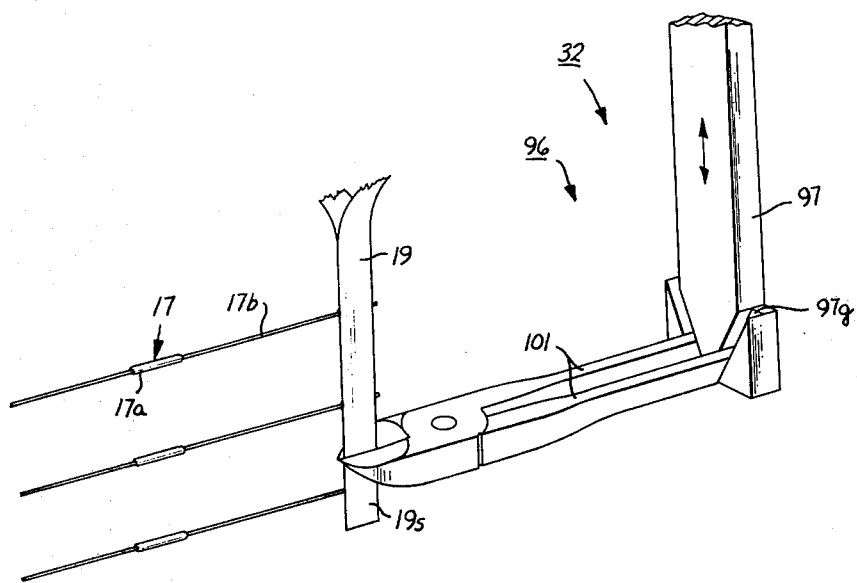
FIG. 9 is an isometric view of a tape cutting mechanism of one of the processing heads shown in FIGS. 2 and 3.

In this connection, the processing heads 21 are selectively energized in coordination with indexing of the conveyor 26, in response to signals from a suitably programmed or punched-taped controller 27 (FIG. 1), to deposit the components 17 on the conveyor in a desired sequence and on relatively close center-to-center spacings, such as ⅜ inch. The conveyor 26 then transfers the components 17 in a direction perpendicular to their path of advancement through the processing heads 21, through a test station 28 and into a component retaping station 29, in which the components are retaped on the closely spaced centers, after which the retaped components (designated by the reference numeral 17R in FIG. 1) are taken up on a power-driven reel 31 for subsequent use in a component inserting machine. Prior to each component lead severing operation in each of the processing heads 21, a tape cutting mechanism 32 (FIGS. 2 and 9) in the head also severs the elongated tapes 19, containing the scrap outer portions of the leads 17b, into small segments 19s as illustrated by broken lines in FIG. 2, to facilitate the ejection, storage and disposal thereof.

While the optimum theoretical center-to-center spacing of the processing heads 21 is the same as the desired retaped center-to-center spacings of the components 17, where the retaped center-to-center spacings of the components is to be relatively small, such as ⅜ inch as noted above, a processing head of corresponding size generally lacks sufficient structural strength and lead shearing capability to process larger ones of the components 17 effectively. Accordingly, in the illustrated embodiment of the invention, the heads 21 preferably are constructed of a size that they can be located on center-to-center spacings twice that of the desired center-to-center spacings of the retaped components 17, that is, on ¾ inch centers, to produce heads having more universal application from the standpoint of the range of component sizes wich can be processed. Accordingly, it is seen that under certain conditions, depending on the desired retaped sequence of the components 17, an entire section of the conveyor 26 between the two outermost processing heads 21 can be filled with components utilizing only two indexing steps of the conveyor. It is to be understood, of course, that in certain applications involving the processing of only miniature electrical components 17, in which structural strength and lead shearing capability of the processing heads 21 are less critical, the processing heads may be constructed on a scale enabling location thereof on the same spacing as that on which the components are to be retaped (e.g., ⅜ inch), in which case an entire section of the conveyor 26 can be filled with components in a desired sequence simultaneously.

As is best shown in FIG. 1, the essentially planar processing heads 21 are arranged in their close side-by-side relationship in a opening in an upstanding vertical support frame 33 on which the supply reels 18 are mounted. To reduce the size of the apparatus, the supply reels 18 preferably are mounted on the front and back of the support frame 33 and the strips of the components 17 are trained from the reels into the frame opening and linearly into the processing heads 21 by a system of guide plates, rods and rollers 34 mounted on suitable support members 36, without any significant twisting of the strips which could cause the leads 17b of the components to bend or jam in the heads. Each of the processing heads 21 is identical in construction and operation, as will subsequently be described.

As is best shown in FIGS. 2, 3 and 4, each processing head 21 includes a vertical passageway through which a respective strip of components 17 is fed from top to bottom, with the components subsequently being discharged from the lower end of the head onto the conveyor 26. The passageway is defined in part by a pair of forward and rearward frame end members 41 and 42, respectively, having opposed vertically extending guide slots for receiving the taped outer portions of the strip of components 17 therein. Planar lateral limits of the head 21 are defined by a pair of frame side plates 43 and 44 (broken away in FIGS. 2 and 3), respectively, secured to the frame end members 41 and 42 and between which the various mechanisms 22, 23, 24 and 32 of the head are located in essentially coplanar relationship in a manner to be described.

Figure 5:
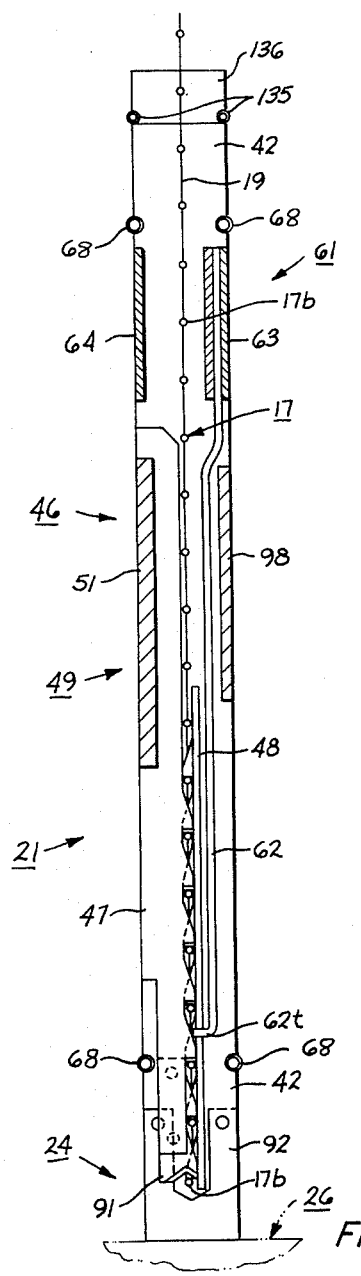
FIG. 5 is a cross-sectional view of a portion of the processing head shown in FIGS. 2 and 3, taken along the line 5—5 in FIG. 2, in a first operating position.
Figure 6:
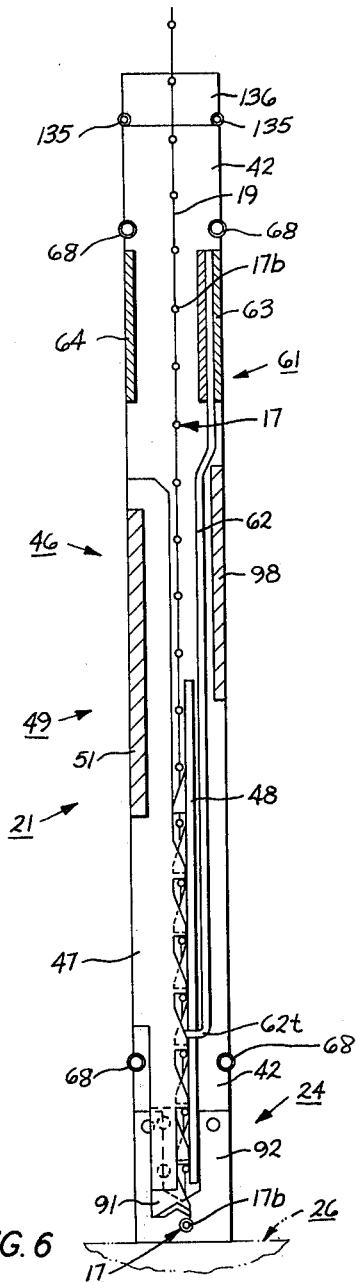
FIG. 6 is a cross-sectional view of the portion of the apparatus shown in FIG. 5, in a second operating position.

Referring to FIGS. 2, 3, 4 and 5, each strip of taped components 17 is initially inserted into the upper end of the passageway in its respective head 21 so that the leads 17b of the first component in the strip are captured in a pair of ratchet and pawl mechanisms 46 (shown in detail in FIG. 5) of the component feeding mechanism 22, and more specifically, so that the leads are engaged beneath at least the uppermost projecting teeth of a pair of vertically reciprocable ratchet members 47 (FIGS. 3, 4 and 5). Each ratchet and pawl mechanism 46 also includes a toothed pawl member 48 (FIGS. 2, 4 and 5) in opposed spring-loaded relationship to the ratchet member 47 of the mechanism, with the pawl member fixed against vertical movement but capable of horizontal and pivotal deflection by the component leads 17b during a component advancing step. Accordingly, upon downward movement of the ratchet members 47 to a lower position, as shown in FIG. 6, the upper teeth thereof advance the strip of components 17 downward until the leads of the first component in the strip have ridden past uppermost teeth of the pawl members 48. Then, when the ratchet members 47 are moved vertically upward back to their position as shown in FIG. 5, the leads 17b of the first component 17 in the strip are retained against regressive movement with the ratchet members by the uppermost teeth of the pawl members 48. Thus, as this reciprocation of the ratchet members 47 between their upper (FIG. 5) and lower (FIG. 6) positions continues, the strip of components 17 is progressively fed downward through the passageway in the processing head 21 toward the conveyor 26.

The ratchet members 47 form a part of a vertically reciprocable sub-assembly 49 (FIGS. 3–6) which also includes a horizontally extending mounting bar 51 on which the ratchets are fixedly secured by suitable screws. The mounting bar 51 is supported for lost-motion movement on sets of dual-headed piston rods 52 (FIGS. 3 and 4) having intermediate portions disposed in openings in respective ones of the frame end members 41 and 42, and having upper and lower head portions slidably disposed in air cylinders 53 (best shown in FIG. 2) formed in upper and lower portions of these members. The lost-motion mounting of the bar 51 includes pairs of vertically extending slots in the bar adjacent the opposite ends thereof, and upper and lower sets of spaced retaining screws 54 slidably received in the slots and threaded into the intermediate portions of the piston rods 52. The lost-motion mounting of the bar 51 is provided to permit opening of the tape cutting mechanism 32 (FIGS. 2 and 9) in a manner subsequently described herein, to release the tapes 19 so that the strip of components 17 may be advanced by the ratchets 47. Vertical movement of the piston rods 52 is limited by plastic plug members 56 (FIG. 2) secured in the upper and lower ends of the air cylinders 53 by suitable dowels. Vertical movement and possible overtravel of the bar 51 after the piston rods 52 reach the end of their movement, is positively limited by plastic stop members 57 (FIG. 3) secured to the frame end members 41 and 42 and disposed in suitable slots in the bar.

The pawl members 48 of each processing head 21 form a part of a sub-assembly 61 (FIGS. 2, 5 and 6) which also includes a pair of vertically extending leaf-spring members 62 for retaining the pawl members against vertical movement, while permitting the horizontal and pivotal deflection thereof by the component leads 17b in a component feeding operation as above described. The leaf-spring members 62 are secured at their upper ends to a horizontal support plate 63 having opposite end portions received in recesses in the frame end members 41 and 42 and secured to the end members. The lower end of each leaf spring 62 is formed with a pair of spaced laterally projecting tangs 62t (FIGS. 5 and 6) which are received in side slots of its respective pawl member 48 to permit the desired deflection and pivoting of the pawl member during a component feeding operation. On the other side of the processing head 21, referring to FIG. 3, opposite end portions of a brace plate 64 similar to the support plate 63 of the pawl sub-assembly 61, also is secured to the frame end members 41 and 42 in suitable recesses therein.

Compressed air is alternately introduced into the opposite ends of the air cylinders 53 of each processing head 21 to reciprocate its ratchet members 47 by a pneumatic system including a 4-way valve 66 (FIG. 10) and upper and lower air connector plugs 67 (FIGS. 2 and 3) screw threadably mounted in the rearward frame end member 42 in communication with upper and lower sets of air tubes 68 rigidly mounted in aligned grooves on the opposite sides of the end member. The air tubes 68 are located in alignment with similar air tubes 69 rigidly mounted in grooves on the opposite sides of the forward frame end member 41, with the adjacent ends of the air tubes enclosed by plastic tube members 71, and with the opposite front ends of the air tubes pneumatically sealed by end plugs 72.

In the illustrated embodiment of the invention, each processing head 21 includes a manually operated switch 73 (FIGS. 2, 3 and 10) mounted on the front thereof for actuating the air valve 66 (FIG. 10) for the head independently of the controller 27 (FIG. 1), to accomplish initial downward feeding of one of the strips of components 17 into the head as above described, and to facilitate manual clearing of the head in the event it becomes jammed during operation. The switch 73 is of a toggle type which is wired such that when the switch is in a first position the head is in an automatic operating mode under the direction of the controller 27. When the switch 73 is flipped from its first position to a second position, however, it energizes the air valve 66 to cause downward movement of the piston rods 52 (FIGS. 2 and 3), and when the switch is flipped back to its first position, the piston rods are returned to their initial "up" condition. A pair of signal lights 74A and 74M (FIGS. 2 and 3) on the front of the head 21 may be utilized to indicate whether the head is in an automatic operating mode under the direction of the controller 27 (switch 73 in first position), or is in its manually operated "down" state (switch 73 in second position), if so desired.

The component centering mechanism 23 of each processing head 21 includes first and second pairs of guide fingers 76 (FIG. 2) and 77 (FIG. 3) for engaging the ends of the bodies 17a of the components 17 on opposite sides of their leads 17b. The first guide fingers 76 are pivotally mounted on a plate member 78 fixedly secured adjacent its opposite ends in recessed portions of the frame end members 41 and 42. The first guide fingers 76 also have intermeshed gear portions 76g for causing pivoting of the fingers in unison, and component body engaging portions of the guide fingers are biased toward one another by a coil spring 81 to engage and automatically center each component body 17a, regardless of its length, with respect to the lead severing mechanism 24. To reduce the friction which the guide fingers 76 exert on each component body 17a, an adjustable stop screw 82 is mounted on the plate member 78 for engagement with a projecting lug on one of the guide fingers, to limit the degree of closure of the fingers by the coil spring 81. The second guide fingers 77 (FIG. 3) are mounted in the same manner on a second plate member 83, which is secured in recessed portions of the frame end members 41 and 42, and also have associated therewith a coil biasing spring 84 and an adjustable stop screw 86.

Figure 7:
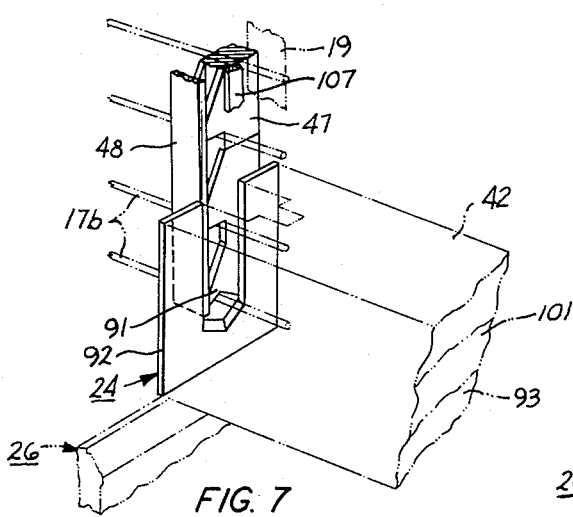
FIG. 7 is an isometric view illustrating a lead cutting mechanism of one of the processing heads shown in FIGS. 2 and 3.
Figure 8:
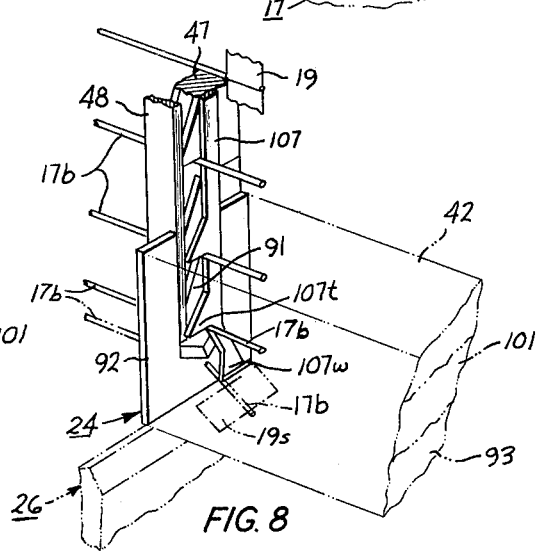
FIG. 8 is an isometric view similar to FIG. 7, illustrating a tape-segment ejecting mechanism of one of the processing heads shown in FIGS. 2 and 3.

As is best shown in FIGS. 5, 6 and 7, the lead cutting mechanism 24 of each processing head 21 includes a cutting blade 91 fixedly mounted on the lower end of each of the ratchet members 47 and having an inverted V-shaped cutting edge located so as to define a lowermost tooth of the ratchet member. Accordingly, as each component 17 is advanced through the processing head 21 by the ratchets 47, the leads 17b of the component ultimately are engaged by the cutting blades 91, as shown in FIG. 5. On the next downward stroke of the ratchets 47, the cutting blades 91 then advance the component 17 downward and cooperate with fixed cutting blades 92 to sever the leads 17b, as shown in FIG. 8, whereupon the component is discharged onto the conveyor 26 by the movable cutting blades 91. Each of the fixed cutting blades 92 is of a generally U-shaped configuration, with spaced parallel vertical legs interconnected by a lower bight portion having an upwardly facing V-shaped cutting edge. The fixed cutting blades 92 are fixedly mounted on respective ones of the frame end members 41 and 42, and on retaining plates 93 (FIG. 2) of the tape cutting mechanism 32.

The tape cutting mechanism 32 includes a pair of forward and rearward cutting devices 96 (FIGS. 2 and 9), one for cutting each of the opposed sets of the elongated tapes 19. Each of the tape cutting devices 96 includes a vertical control rod 97 of rectangular cross section which is slidably disposed in a vertical passage in the adjacent frame end member 41 or 42. Each control rod 97 is fixed adjacent its upper end to a vertically reciprocable mounting bar 98 (FIG. 2) movement therewith and has a V-shaped groove 97g (FIG. 9) formed therein adjacent its lower end. The mounting bar 98 is fixedly mounted on the intermediate portions of the dual-headed piston rods 52 on the opposite sides thereof from the ratchet mounting bar 51 (FIG. 3).

Each cutting device 96 includes a pair of cutter blades 101 having opposed cutting edges at one end and having opposite ends riding in respective legs of the V-shaped groove 97g in the control rod 97. Each pair of cutting blades 101 is pivoted on a cylindrical portion of a shoulder screw 102 (FIG. 2) mounted in and extending upward from the adjacent retaining plate 93. The retaining plate 93 is mounted on the lower end of the respective frame end member 41 or 42 by small side cover plates 104 (FIGS. 2 and 3) aligned with the main side plates 43 (FIG. 2) and 44 (FIG. 3) and secured to the frame end member and to the retaining plate by suitable screws.

From the foregoing description, it is seen that as the control rods 97 move downward, the ends of the cutting blades 101 riding in the V-shaped grooves 97g cause the cutting blades 101 to open, while upward movement of the control rods causes the cutting blades to close and to cut the sets of tapes 19. More specifically, upon the return of the control rods 97 to their uppermost positions at the end of each component sequencing cycle, the blades 101 are closed to cut the tapes 19 in a first position on the path of linear movement of the taped components 17 through the processing head 21, in preparation for the next component sequencing cycle. Then, on initial downward movement of the piston rods 52 (FIGS. 2 and 3) in the next component sequencing cycle, the control rods 97 cause the cutting blades 101 to open and to release from the cut tapes 19 to permit feeding of the tapes, and thus of the strip of components 17 of which they form a part, by the ratchets 47 (FIGS. 3, 5 and 6). Subsequently, the ratchet mounting member 51 (FIGS. 3, 5 and 6), which initially remained stationary as a result of its lost-motion mounting on the piston rods 52, is moved by the piston rods to operate the ratchets 47 thereon to feed the strip of components 17 downward one step relative to the tape cutting blades 101. During this feeding operation the lead cutting blades 91 mounted on the ratchets 47 move the lowermost component 17 and just cut tape segments or portions 19s secured to its leads 17b downward away from the tape cutting blades 101 and past the fixed cutting blades 92, as is apparent from FIGS. 2 and 5–9. Accordingly, the cutting blades 91 and 92 (FIGS. 5, 6 and 7) sever the leads 17b of the lowermost component 17 in the strip to length (FIG. 8), and from the just cut tape segments 19s (FIGS. 2, 8 and 9), in a second position located on the linear path of movement of the taped components below the above-mentioned tape cutting position with the inherent shock forces of the lead cutting operation facilitating ejection of the tape segments from the processing head 21 into a suitable receptacle (not shown).

However, to insure positive ejection of the cut segments 19s of the adhesive tapes 19 from each processing head 21, leaf-spring ejector members 107 (FIG. 8) are fixedly mounted adjacent their upper ends on the sides of the head's ratchet members 47. Each of the leaf-spring ejector members 107 includes a tooth portion 107t and an outwardly directed wiper portion 107w adjacent its lower end, which normally extends into the slot defined by the legs of the adjacent fixed cutting blade 92. During a lead severing operation, the lower end of the ejector member 107 initially travels in the slot of the fixed cutting blade 92 until the movable cutting blade 91 has sheared through the lead 17b, whereupon the tooth portion 107t engages the outer portion of the severed lead to propel the previously severed tape segment 19s and the outer lead portion therein downward out of the apparatus. At the same time, the wiper portion 107w and the tooth portion 107t ride over the adjacent surface of the fixed cutter blade 92 to perform a cleaning operation thereon, as for example, to remove any extraneous adhesive therefrom.

Referring to FIG. 2, reversal of the piston rods 52 in each of the processing heads 21 to restore the head to its initial condition for a next component sequencing cycle, is accomplished by the mounting bar 98 of the head closing a lower limit switch 112 mounted in an opening in the head's rearward frame end member 42. Operation of the limit switch 112 causes energization of the 4-way air valve 66 (FIG. 10) to switch the introduction of compressed air into the head 21, from the upper air connector plug 67 to the lower air connector plug 67, and provides a signal to the controller 27 (FIG. 1) to advance the conveyor 26.

Referring to FIG. 2, improper feeding of one of the strips of components 17 by the feed mechanism 22 in each processing head 21 is detected by a system within the head including an upper limit switch 113 mounted on the rearward frame end member 42, and a pair of limit switches 114 and 116 mounted on inwardly directed lugs of the plate member 78 of the component centering mechanism 23. The pair of limit switches 114 and 116 open on each feed cycle in response to deflection of their respective pawl members 48, and if the strip of components 17 is fed properly, whereby the pawl members return to their original positions, reclose to indicate that proper feeding of the components occurred. Reclosure of all of the limit switches 113, 114 and 116 provides an indication to the controller 27 that the processing head 21 is ready for a new processing cycle and the apparatus continues to operate. However, failure of either of the limit switches 113, 114 and 116 to reclose provides an indication to the controller 27 that the processing head 21 has malfunctioned, whereupon the controller stops the apparatus and energizes an indicating light 117 on the front of the processing head. Clearing of the processing head 21 then may be accomplished by sliding it to its forward position as illustrated in broken lines in FIG. 10, and cycling it manually by operation of the toggle switch 73 (FIGS. 2 and 3), which is wired to override the limit switches 113, 114 and 116 so as to cause energization of the air valve 66 associated with the head, and thus operation of the head independently of the controller 27 (FIG. 1), as noted hereinabove.

Each of the limit switches 114 and 116 is retained in its normally closed condition by a small cam member 119 (FIG. 2) and a coil spring 121 disposed in recesses in the cam member and a portion of the adjacent frame end member 41 or 42. Opening of each of the switches 114 or 116 during a component feeding operation is accomplished by the deflection of the adjacent pawl member 48, through an operating lever 122 (FIG. 2) fixed to its cam member 119. More specifically, the operating lever 122 is in the form of a rigid wire having a vertically extending leg provided with a horizontal foot portion engaged against the pawl member 48, and also having a horizontal leg pivotally mounted in a groove in the adjacent frame end member 41 or 42 and secured to the cam member 119, such as by soldering. Accordingly, deflection of the pawl member 48 during a component feeding operation causes pivoting of the lever member 122 about its horizontal leg to deflect the cam member 119 so that the limit switch 114 or 116 is moved to an open condition by means of an internal biasing spring (not shown). If the leads 17b of the components 17 feed properly relative to the pawl member 48, upon return of the pawl member to its original position the coil spring 121 restores the cam member 119 to its original position to reclose the limit switch 114 or 116. However, if the component leads 17b feed improperly and become jammed between one or both of the pawl members 48 and their opposed ratchet members 47, whereby one of the pawl members is not restored to its original position, the associated limit switch 114 or 116 remains open indicating to the controller 27 that the processing head 21 has malfunctioned as set forth above.

As is best shown in FIG. 10, the component processing heads 21 are located on suitable support rails 126 and are slidably mounted in their side-by-side relationship for movement between their inner and outer positions independently, to facilitate maintenance and/or replacement of the heads as necessary. More specifically, the air line connectors 67 (FIGS. 2 and 3) of each processing head 21 are plug members of a quick-release type which can be readily coupled to, or decoupled from, mating air line chuck members 127 (FIG. 10) fixedly mounted on a support frame 128. The upper edge of the support frame 128 is mounted, by means of suitable rollers or ball bearings 129, on a horizontally disposed fixed guide track 131, for movement between the inner and outer positions, and the associated air valve 66, which also is mounted within the support frame 128, is connected to an air supply (not shown) by a flexible looped tube 132 so as to permit this movement.

Each processing head 21 also includes an electrical plug 133 (FIGS. 2 and 3) insertable into a mating electrical receptacle 134 (FIG. 10) on the support frame 128 to provide electrical connections for the limit switches 112, 113, 114 and 116, and the signal lights 74 and 117 in the processing head. Wiring for the limit switches 114 and 116 and the signal lights 74 and 117 is extended thereto through suitable passages in the frame end members 41 and 42, and wiring tubes 135 (FIGS. 2 and 3) retained on the frame end members on opposite sides thereof by top cover plates 136 secured to the end members.

Figure 11:
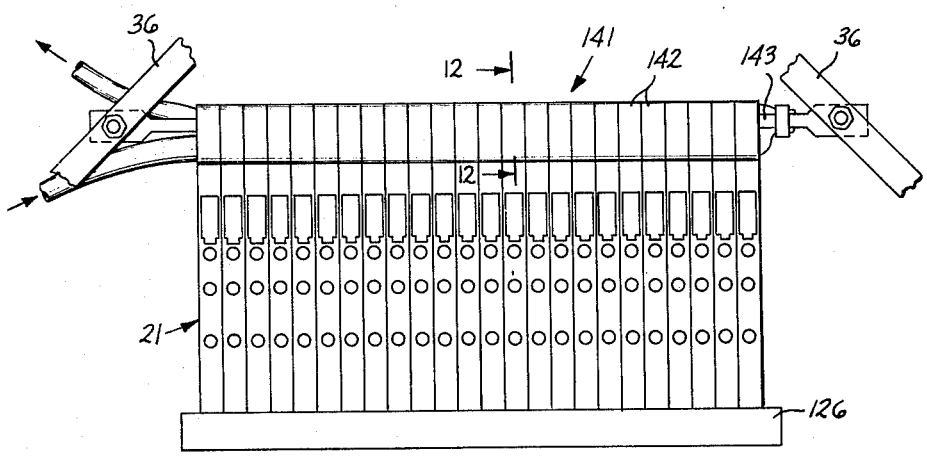
FIG. 11 is a side elevational view of an air-cushion clamping mechanism for retaining a bank of the processing heads shown in FIGS. 2 and 3 in operative positions.
Figure 12:
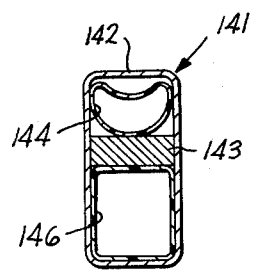
FIG. 12 is a cross-sectional view of the air-cushion clamping mechanism taken along the line 12—12 in FIG. 11, illustrating an operative condition of the clamping mechanism.

Referring to FIGS. 11 and 12, the processing heads 21 are retained in their inner component processing positions against movement and against vibration by an air-cushion clamping mechanism 141 which includes a series of adjacent rectangular clamping members 142 aligned with respective ones of the processing heads 21. The clamping members 142 have open interiors, through which a mounting rod 143 extends axially, with the opposite ends of the mounting rod being fixedly mounted on adjacent support members 36 for certain of the tape guide rollers 34 (FIG. 1). Upper and lower inflatable air diaphragms 144 and 146 (FIG. 12) are mounted on opposite sides of the mounting rod 143 between the rod and the inner edges of the clamping members 142. When all of the processing heads 21 have been inserted in their inner positions, deflation of the upper air diaphragm 144 and inflation of the lower air diaphragm 146, as illustrated in FIGS. 11 and 12, causes the clamping members 142 to be moved downward into engagement with their respective processing heads 21 to lock the processing heads in these positions on the support rails 126. Conversely, when the upper air diaphragm 142 is inflated and the lower air diaphragm 146 is deflated, the clamping members 142 are moved upward so that the processing heads 21 can be moved to their outer positions independently, by causing each head and its associated support frame 128 (FIG. 10) to slide outward on their guide track 131 (FIG. 10), whereupon maintenance of the head or removal of the head from the apparatus readily may be accomplished.

Figure 13:
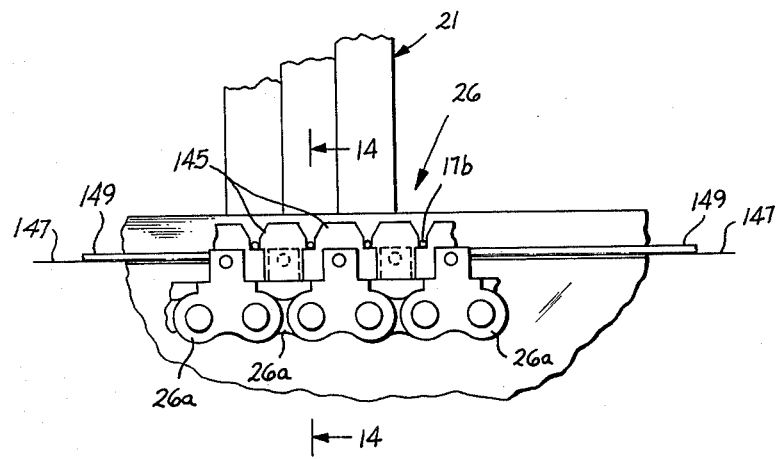
FIG. 13 is an enlarged view of a portion of a component transporting conveyor used in the apparatus shown in FIG. 1, taken along the line 13—13 in FIG. 2.

Referring to FIG. 13, the conveyor 26 is of a flexible chain-belt type in which successive links 26a are provided with upstanding members 145 of a suitable electrically insulating material, such as plastic. The plastic members 145 receive respective leads 17b of the components 17 therebetween at the aforementioned closely spaced intervals (e.g., ⅜ inch) such that when the components are retaped on this interval in the retaping station 29, the resultant retaped components are suitable for use in a component inserting machine. The conveyor 26 is intermittently indexed in steps corresponding to the intervals between the upstanding plastic members 145 under the direction of the controller 27.

Figure 14:
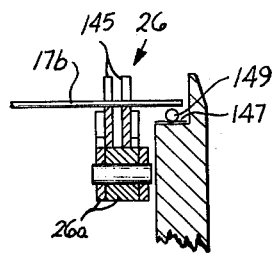
FIG. 14 is a cross-sectional view taken along the line 14—14 in FIG. 13.

Retaping of the component leads 17b in the retaping station 29 (FIGS. 1 and 15) is accomplished by pressing the leads between first and second opposed adhesive tapes 147 and 148 and winding the resultant strip of components 17R, in which the components are arranged in a desired sequence on close center-to-center spacings, on the power-driven take-up reel 31 (FIG. 1) as above described. The first tapes 147 are fed in spaced relationship from supply reels (not shown) located to the left of the bank of processing heads 21 as viewed in FIG. 1 and then travel through the upper pass of the conveyor 26 on opposite sides of the plastic members 145 (FIGS. 13, 14 and 15) and beneath the components 17 being discharged on the conveyor from the processing heads. A lubricated elongated thin rod 149 (FIGS. 13 and 14), which has been coated with a suitable plastic having a low coefficient of friction, is secured at the upstream end of the conveyor 26 to the conveyor frame and rides on the adhesive side of the adjacent tape 147 to hold it down and preclude it from prematurely adhering to its respective component leads 17b, so as not to disturb the positions of the components 17 on the conveyor prior to their reaching the retaping station 29. The second tapes 148 are fed in spaced relationship from supply reels 150 located to the right of the bank of processing heads 21 in FIG. 1, and into opposed pressure engagement with the lower first tapes 147 in the retaping station 29, in which the adhesive sides of the tapes are pressed together so that the outer portions of the component leads 17b become secured between the tapes.

Figure 15:
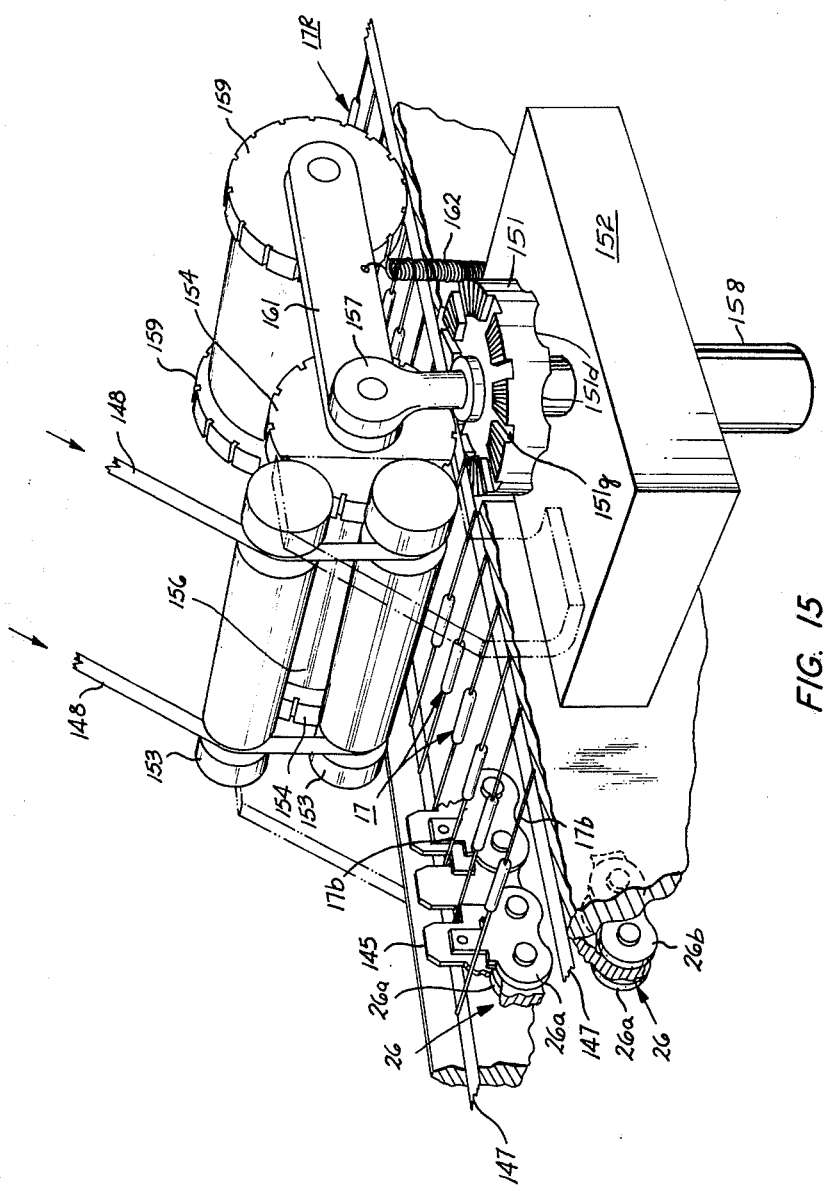
FIG. 15 is an isometric view of a component retaping station utilized in the component processing apparatus of FIG. 1.

Referring to FIG. 15, the lower adhesive tapes 147 travel over small metal turntables 151 each mounted for rotation on a vertical axis on a respective support block 152 secured to the frame of the conveyor 26. The upper tapes 148 pass around sets of guide rollers 153 and then pass about upper pressure rollers 154 mounted on opposite ends of a cylindrical carrier member 156 and constructed of a quasi-resilient material, such as polyurethane plastic. The cylindrical member 156 is supported for free rotation by means of shaft extensions at its opposite ends journaled in suitable mountings on the upper ends of piston rods 157 (only one shown) of a pair of air cylinders 158. Each of the air cylinders 158 is fixedly mounted to the underside of a respective one of the support blocks 152 with the piston rod 157 of the air cylinder extending vertically upward through the support block and the turntable 151 mounted thereon. In operation, taping pressure between the turntables 151 and the pressure rollers 154 may be regulated by controlling the amount of air pressure delivered to the air cylinders 158.

Preferably, the underside of each of the turntables 151 has depressions 151d formed therein for receiving the upper portions of outer links 26b (FIG. 15) of the conveyor 26, whereby the turntable is rotatably driven by the conveyor. The upper side of each turntable 151 also is formed with relatively wide peripherally spaced grooves 151g for receiving respective ones of the component leads 17b, and with tape gripping serrations between the grooves to facilitate pressing of the tapes 147 and 148 about the leads, and so that the turntables effectively assist the take-up reel 31 in advancing the tapes. Taping of the leads 17b also is facilitated by constructing the upper pressure rollers 154 with peripheral grooves for engaging about the leads 17b during the taping operation. In addition, a second set of upper pressure rollers 159, identical to the rollers 154, is mounted on the shaft extensions of the cylindrical carrier member 156 by pivoted links 161, and is biased downward by coil springs 162, to preclude premature rising of the retaped strip of components 17R as it travels from the first upper pressure rollers towards the take-up reel 31 (FIG. 1).

In summary, a new and improved system for rapidly processing taped electrical components, such as the electrical components 17 having the taped axial leads 17b, in an economic and efficient manner, has been provided. As the strips of the components 17 are fed from their respective supply reels 18 along parallel linear paths through the processing or sequencing heads 21 by the linearly reciprocable feed mechanisms 22 of the heads, the components initially are automatically centered in the heads relative to the lead cutting mechanism 24, regardless of the length of the bodies 17a of the components, by the sets of intermeshed guide fingers 76 and 77 of the component centering mechanisms 23. As the strips of the centered components 17 continue along their parallel linear paths, inner portions of the leads 17b of the components are cut to equal lengths from outer portions of the leads and the tapes 19 by the lead cutting mechanisms 24, and the components are simultaneously discharged directly into closely spaced center-to-center positions on the conveyor 26 in a desired sequence. Subsequently, the severed component leads 17b are retaped in their same closely spaced center-to-center positions on the conveyor 26 in the lead taping station 29.

In this connection, the unique and novel construction of the pneumatic processing heads 21, wherein the linearly reciprocable piston rods 52 drive the component advancing ratchets 47 to advance the components 17 along their parallel linear paths, and wherein the lead cutting blades 91 are mounted on the ratchets as extensions thereof for shearing the component leads 17b while continuing to advance the components along their parallel linear paths, enables the heads to be of an essentially planar construction whereby they can be located on relatively close center-to-center spacings similar to the desired center-to-center spacings on which the components 17 are to be retaped. This produces an apparatus which is compact in size, and also facilitates the filling of sections of the conveyor 26 with the components 17 in a desired sequence utilizing a minimum number of indexing steps of the conveyor, thereby producing an apparatus having a high component processing rate of production.

In connection with the severing of the component leads 17b from the tapes 19, ejection of the tapes from the apparatus is facilitated by the severing of the tapes into the small tape segments 19s to separate each of the components 17 and its leads from the remaining taped components prior to cutting the leads of the component to length, utilizing the tape cutting devices 96 in the processing heads 21. As a result, the inherent shock forces involved in the subsequent lead cutting operation are utilized to discharge the small tape segments 19s from the apparatus, with positive ejection of the tape segments being insured by the ejector members 107 mounted on the component advancing ratchets 47.

During the above-described operation of the apparatus, the processing heads 21 are effectively retained in their operative positions against vibration by the air-cushion clamping mechanism 141. In addition, the slidable mounting of the bank of essentially planar processing heads 21 for movement into and out of their operating positions independently of one another, with the heads also being operative in their outer positions, and including the quick-releasable mounting of the heads on their support frames 128, facilitates maintenance and replacement of the heads as necessary.

What is claimed is:

1. A method of processing taped components onto preselected center-to-center spacings, wherein leads of the components are joined in spaced relationship by interconnecting tapes secured to the leads, which comprise the steps of:

advancing the taped components along a preselected linear path;

cutting the interconnecting tapes between the leads of the taped components at a first position on the linear path;

engaging the leads of each of the taped components with a first cutting means which is linearly reciprocable along the linear path;

moving the first cutting means along the linear path to advance each of the taped components and cut portions of the tapes secured to the leads of the component further along the linear path away from the tape cutting first position and to move the leads of the component past a second cutting means at a second position on the linear path;

cutting the leads of each component to length from the cut portions of the tapes in the second position on the linear path by the first and second cutting means; and feeding each component from the second position on the linear path into a respective position on the preselected center-to-center spacings after the leads of the component have been cut to length from the cut portions of the tapes.

2. A method as recited in claim 1, which further includes the steps of:

transferring the fed components, in their positions on the preselected center-to-center spacings, in a direction essentially perpendicular to the direction of advancement of the components along the linear path; and retaping portions of the cut leads remaining on the components, on the preselected center-to-center spacings, during said transferring of the components.

3. A method of processing taped components onto preselected center-to-center spacings in a desired sequence, wherein the taped components extend from separate supplies and the leads of the components are joined in spaced relationship by interconnecting tapes secured to the leads, which comprise the steps of:

advancing the taped components along parallel linear paths;

cutting the interconnecting tapes between the leads of the taped components at first positions on their respective parallel linear paths;

engaging the leads of the taped components with respective ones of a plurality of first cutting means which are linearly reciprocable parallel to one another along respective ones of the parallel linear paths;

selectively moving the plurality of first cutting means along their respective parallel linear paths to advance the taped components and cut portions of the tapes secured to the leads of the components further along the linear paths away from the tape cutting first positions and to move the leads of the components past respective additional second cutting means at second positions on the linear paths;

cutting the leads of the components to length from the cut portions of the interconnecting tapes in the second positions on the parallel linear paths by the first and second cutting means; and feeding the components from the second positions on the parallel linear paths into desired positions on the preselected center-to-center spacings as the leads of the components are cut to length from the cut portions of the interconnecting tapes.

4. A method as recited in claim 3, which comprises the additional step of:

retaping portions of the cut leads remaining on the components on the preselected center-to-center spacings.

5. A method as recited in claim 3, which further includes the steps of:

transferring the fed components, in their positions on the preselected center-to-center spacings, in a direction essentially perpendicular to the direction of advancement of the components along the parallel linear paths; and retaping portions of the cut leads remaining on the components, on the preselected center-to-center spacings, during said transferring of the components.

6. A method as recited in claim 3, wherein the step of advancing the components includes:
advancing the taped components along parallel linear paths on spacings not greater than twice the preselected center-to-center spacings into which the separated components are fed as the leads of the components are cut to length from the tapes.

7. A method of processing taped components extending from separate supplies, wherein axial leads of the components are joined in spaced relationship by interconnecting tapes secured to the leads, which comprises the steps of:
advancing the taped components along parallel linear paths;
cutting the interconnecting tapes between the axial leads of the taped components at first positions on their respective parallel linear paths to separate each component and its leads from the remaining taped components as the components are advanced along the parallel linear paths;
engaging the leads of the taped components with respective ones of a plurality of first cutting means which are linearly reciprocable parallel to one another along respective ones of the parallel linear paths;
selectively moving the plurality of first cutting means along their respective parallel linear paths to advance the separated components and cut portions of the tapes secured to the leads of the components further along the linear paths away from the tape cutting first positions and to move the engaged leads of the separated components past respective additional second cutting means at second positions on the linear paths;
cutting the axial leads of the separated components to length from the cut portions of the tapes in the second positions on the parallel linear paths by the first and second cutting means;
feeding the separated components from the second positions on the parallel linear paths into retaping positions on preselected center-to-center spacings as the axial leads of the separated components are cut to length from the cut portions of the tapes;
transferring the fed components, in their retaping positions on the preselected center-to-center spacings, in a direction essentially perpendicular to the direction of advancement of the components along the parallel linear paths; and
retaping portions of the cut leads remaining on the components, on the preselected center-to-center spacings, during said transferring of the components.

8. A method as recited in claim 7, wherein the step of advancing the components includes:
advancing the taped axial lead components along parallel linear paths on spacings not greater than twice the center-to-center spacings into which the components are fed for retaping.

9. Apparatus for processing taped components, wherein leads of the components are joined in spaced relationship by interconnecting tapes, which comprises:
linearly reciprocable feed means for advancing the taped components along a preselected linear path; and
means for cutting the leads of the taped components to length from the interconnecting tapes as the components are advanced along the preselected linear path, said lead cutting means being mounted in part adjacent the preselected linear path and in part on said feed means for movement therewith along the preselected linear path to engage and advance the leads of each component along the preselected linear path while simultaneously cutting the leads of the component to length.

10. Apparatus as recited in claim 9, which further comprises:
opposed movable means spring biased toward one another for engaging and centering a body of each component therebetween with respect to said lead cutting means.

11. Apparatus as recited in claim 10, in which:
said opposed movable means includes a pair of pivoted centering fingers, said fingers having intermeshed portions for causing pivoting of said fingers in unison and having guide portions biased toward one another to engage and center the body of each component with respect to said lead cutting means.

12. Apparatus as recited in claim 9, which further comprises:
tape cutting means for cutting portions of the tapes which are secured to the leads of each component to separate the component from the remaining taped components; and
means reciprocable with said linearly reciprocable feed means essentially in a plane extending parallel to and containing the preselected linear path, for operating said tape cutting means.

13. Apparatus as recited in claim 12, in which:
said operating means includes means for causing said tape cutting means to cut the portions of the tapes which are secured to the leads of each component prior to the cutting of the leads of the component by said lead cutting means.

14. Apparatus as recited in claim 13, which further comprises:
means mounted on said linearly reciprocable feed means and movable therewith for ejecting the cut portions of the tapes after the leads of the component have been cut by said lead cutting means.

15. Apparatus for processing taped axial lead components, which comprises:
linearly reciprocable feed means for advancing the taped axial lead components along a preselected linear path;
means for cutting the axial leads of the components to length from respective tapes as the components are advanced along the preselected linear path, said lead cutting means being mounted in part adjacent the preselected linear path and in part on said feed means for reciprocation therewith to engage and advance the leads of each component along the preselected linear path while simultaneously cutting the leads of the component length;
linearly reciprocable fluid-operated drive means for reciprocating said feed means; said drive means, feed means and lead cutting means being located in essentially coplanar relationship within planar limits containing the linear path of advancement of the components;
opposed movable means spring-biased toward one another for centering a body of each component therebetween with respect to said lead cutting means;

tape cutting means located in essentially coplanar relationship with said drive means, said feed means and said lead cutting means for cutting portions of the tapes which are secured to the leads of each component to separate the component from the remaining taped components prior to the cutting of the leads of the component by said lead cutting means; and means for ejecting the cut portions of the tapes after the leads of each component have been cut by said lead cutting means.

16. Apparatus for processing taped components, which comprises:

a bank of taped component processing heads in side-by-side relationship;

linearly reciprocable feed means in each of said processing heads for advancing respective ones of the taped components through said head along a preselected linear path;

means in each of said processing heads for cutting leads of the components to length from respective tape portions as the components are advanced along the preselected linear path, said lead cutting means in each of said processing heads being mounted in part adjacent the preselected linear path and in part on said feed means in said head for reciprocation therewith to engage and advance the leads of a component along the preselected linear path while simultaneously cutting the leads of the component to length; and linearly reciprocable drive means in each of said processing heads for reciprocating said feed means.

17. Apparatus as recited in claim 16, in which said linearly reciprocable drive means in each of said processing heads includes:

at least one fluid-type operating cylinder located in essentially coplanar relationship with said linearly reciprocable feed means and said lead cutting means within planar limits containing the path of advancement of the components through said head; and a piston rod slidable in said cylinder and connected to said feed means.

18. Apparatus as recited in claim 16, which further comprises:

opposed spring-biased means in each of said processing heads in essentially coplanar relationship with said feed means and said lead cutting means in said head for centering the components with respect to said lead cutting means as the components are advanced through said head.

19. Apparatus as recited in claim 16, which further comprises:

tape cutting means in each of said processing heads for cutting the tape portions which are secured to the leads of each component to separate the component from the remaining taped components prior to the cutting of the leads of the component by said lead cutting means.

20. Apparatus as recited in claim 27, which further comprises:

means in each of said processing heads for ejecting the cut tape portions from said head after the leads of the component have been cut by said lead cutting means in said head.

21. Apparatus as recited in claim 16, in which:

said processing heads are slidably mounted in side-by-side relationship for movement into and out of operative positions independently of one another.

22. Apparatus as recited in claim 21, which further comprises:

air-cushion clamping means for retaining said processing heads in their operative positions and precluding vibration of said heads.

23. Apparatus as recited in claim 16, which further comprises:

conveyor means movable beneath said processing heads for receiving the components from said heads in retaping positions on preselected center-to-center spacings after the leads of the components have been cut by said lead cutting means; and means for retaping the leads of the components in their preselected center-to-center spacings on said conveyor means as the components are advanced by said conveyor means.

24. Apparatus as recited in claim 23, in which:

said processing heads are located on center-to-center spacings not greater than twice the preselected center-to-center spacings of the components on said conveyor means.

25. Apparatus for processing strips of different taped components extending from a plurality of separate supplies, wherein bodies of the components have opposite axial leads jooined in spaced relationship by elongated tapes, which comprises:

a bank of taped component processing heads of essentially planar configuration slidably mounted in side-by-side relationship for movement into and out of operative positions inependently of one another;

air-cushion clamping means for retaining said processing heads in their operative positions and precluding vibration of said heads;

linearly reciprocable feed means in each of said processing heads for advancing a respective strip of the taped axial lead components through said head along a preselected linear path;

means in each of said processing heads for cutting the axial leads of a component to length from its respective tapes, said cutting means being mounted in part adjacent the preselected linear path and in part on said feed means in said head for reciprocation therewith to engage and advance the leads of the component along the preselected linear path while simultaneously cutting the leads of the component to length;

linearly reciprocable fluid-operated drive means in each of said processing heads for reciprocating said feed means in said head;

opposed movable means in each of said processing heads spring-biased toward one another for centering a body of a component therebetween with respect to said lead cutting means in said head;

tape cutting means in each of said processing heads for cutting portions of the tapes which are secured to the leads of a component to separate the component from the remaining taped components prior to the cutting of the leads of the component by said lead cutting means in said head;

means in each of said processing heads for ejecting the cut portions of the tapes after the leads of a component have been cut by said lead cutting means in said head;

a single conveyor movable beneath said processing heads for receiving the components from said heads in a desired sequence and on preselected center-to-center spacings as the leads of the components are cut by said lead cutting means, said processing heads being located on center-to-center spacings not greater than twice the preselected spacings of the components on said conveyor; and means for retaping the leads of the components on said conveyor on the preselected center-to-center spacings as the components are advanced by said conveyor.

26. Apparatus for processing taped components, wherein leads of the components are joined in spaced relationship by interconnecting tapes, which comprises:
a frame having an essentially planar configuration and including spaced end members between which the taped components are advanceable along a preselected linear path, said frame having sides defining planar limits containing the preselected linear path of advancement of the taped components therethrough;

linearly reciprocable feed means located substantially within the planar limits defined by the sides of said frame for advancing the taped components between the end members of said frame along the preselected linear path;

means located substantially within the planar limits defined by said frame for cutting the leads of the taped components to length from the interconnecting tapes as the components are advanced between the end members of said frame along the preselected linear path, said lead cutting means being mounted in part adjacent the preselected linear path and in part on said feed means for reciprocation therewith to engage and advance the leads of each component past the part of said lead cutting means adjacent the preselected linear path to cut the leads of the component to length;

at least one fluid-type operating cylinder formed in one of the end members of said frame; and a piston rod reciprocable in said cylinder and connected to said linearly reciprocable feed means.

27. Apparatus as recited in claim 26, which further comprises:
a second fluid-type operating cylinder formed in the second end member of said frame; and
a second piston rod reciprocable in said second cylinder and connected to said linearly reciprocable feed means.

* * * * *

UNITED STATES PATENT OFFICE
CERTIFICATE OF CORRECTION

PATENT NO. : 4,043,094

DATED : August 23, 1977

INVENTOR(S) : WILLIAM D. BOHANNON, JR.

It is certified that error appears in the above-identified patent and that said Letters Patent are hereby corrected as shown below:

In the specification, Column 2, line 67, "under" should read --outer--. Column 3, line 15, delete "center" (second occurrence). Column 4, line 29, "24, (FIG. 2)" should read --24 (FIG. 2),--; line 68, "wich" should read --which--. Column 5, line 60, insert --being-- before "fixed". Column 11, line 43, after "27" insert --(FIG. 1)--. Column 16, line 60, after "component" insert --to--. Column 17, line 62, "27" should read --19--. Column 18, line 28, "jooined" should read --joined--.

Signed and Sealed this

Twenty-second Day of November 1977

[SEAL]

Attest:

RUTH C. MASON
Attesting Officer

LUTRELLE F. PARKER
Acting Commissioner of Patents and Trademarks